United States Patent
Collomosse et al.

(10) Patent No.: US 9,203,439 B2
(45) Date of Patent: Dec. 1, 2015

(54) METHOD OF GENERATING A SEQUENCE OF DISPLAY FRAMES FOR DISPLAY ON A DISPLAY DEVICE

(75) Inventors: John Collomosse, Bath Avon (GB); Timothy Paul James Gerard Kindberg, Bristol (GB)

(73) Assignee: Hewlett-Packard Development Company, L.P., Houston, TX (US)

( * ) Notice: Subject to any disclaimer, the term of this patent is extended or adjusted under 35 U.S.C. 154(b) by 2258 days.

(21) Appl. No.: 12/179,857

(22) Filed: Jul. 25, 2008

(65) Prior Publication Data
US 2009/0028448 A1    Jan. 29, 2009

(30) Foreign Application Priority Data

Jul. 27, 2007 (GB) .................................. 0714661.6

(51) Int. Cl.
| | |
|---|---|
| G06K 9/36 | (2006.01) |
| H03M 13/27 | (2006.01) |
| G09G 3/20 | (2006.01) |
| G09G 5/00 | (2006.01) |
| H03M 13/15 | (2006.01) |

(52) U.S. Cl.
CPC ......... *H03M 13/2742* (2013.01); *G09G 3/2022* (2013.01); *G09G 5/006* (2013.01); *H03M 13/2717* (2013.01); *G09G 2320/02* (2013.01); *H03M 13/15* (2013.01); *H03M 13/1515* (2013.01)

(58) Field of Classification Search
USPC ........... 235/462.1, 494; 375/240.27; 348/473; 380/255; 382/100, 233; 455/414.3, 455/466; 705/14.65; 707/104.1; 708/111; 714/762
See application file for complete search history.

(56) References Cited

U.S. PATENT DOCUMENTS

| | | | | |
|---|---|---|---|---|
| 4,410,989 | A * | 10/1983 | Berlekamp | 714/762 |
| 5,488,571 | A * | 1/1996 | Jacobs et al. | 708/111 |
| 5,939,699 | A | 8/1999 | Perttunen et al. | |
| 6,094,228 | A * | 7/2000 | Ciardullo et al. | 348/473 |
| 6,550,685 | B1 * | 4/2003 | Kindberg | 235/494 |
| 2002/0078146 | A1 | 6/2002 | Rhoads | |
| 2004/0026511 | A1 * | 2/2004 | Cheung et al. | 235/462.1 |
| 2005/0080818 | A1 * | 4/2005 | Kindberg et al. | 707/104.1 |
| 2005/0254714 | A1 * | 11/2005 | Anne | 382/233 |
| 2006/0245505 | A1 * | 11/2006 | Limberg | 375/240.27 |
| 2009/0029725 | A1 * | 1/2009 | Kindberg | 455/466 |

(Continued)

FOREIGN PATENT DOCUMENTS

WO    WO 2004/006456 A1    1/2004

OTHER PUBLICATIONS

Gao, J., "Reed Solomon Code", Feb. 19, 2007.*

(Continued)

*Primary Examiner* — Vu Le
*Assistant Examiner* — Xuemei Chen
(74) *Attorney, Agent, or Firm* — Hewlett-Packard Patent Department

(57) ABSTRACT

A method of generating a sequence of display frames for display on a display device, wherein the sequence of display frames are derived from a data string which is encoded to include error correction in order to enable recreation of the data string at a receiving device, includes dividing the data string to be encoded into a plurality of source segments; encoding the plurality of source segments to generate a plurality of codewords, each codeword comprising a plurality of codeword bits; and positioning codeword bits in the sequence of frames.

17 Claims, 8 Drawing Sheets

(56) References Cited

U.S. PATENT DOCUMENTS

| | | | |
|---|---|---|---|
| 2009/0069000 A1* | 3/2009 | Kindberg et al. | 455/414.3 |
| 2010/0020970 A1* | 1/2010 | Liu et al. | 380/255 |
| 2010/0131368 A1* | 5/2010 | Morris et al. | 705/14.65 |
| 2010/0246984 A1* | 9/2010 | Cheong et al. | 382/233 |
| 2011/0103639 A1* | 5/2011 | Moskowitz et al. | 382/100 |

OTHER PUBLICATIONS

Liu, X., et al., "Imaging as an alternative data channel for camera phones," Proceedings of the 5th International Conference on Mobile and Ubiquitous Multimedia (MUM'06), Dec. 4-6, 2006.*

* cited by examiner

METHOD OF GENERATING A SEQUENCE OF DISPLAY FRAMES FOR DISPLAY ON A DISPLAY DEVICE

TECHNICAL FIELD

The present invention relates a method of generating a sequence of display frames for display on a display device. More specifically, the present invention relates to preventing data loss in a data transmission by encoding and decoding data using error correction.

BACKGROUND TO INVENTION

Image sequences, comprising a plurality of display frames, may be transmitted between video displays for passive capture by a camera equipped device. Such transmissions may also encode data within the video image sequence. Data bits may also be presented in an image format, e.g. an animated rectangular grid pattern of black and white cells, to effect data transfer between a video display and a separate camera equipped device passively observing that display.

Transmitting data over such a display-to-device channel is complicated by the potential for data loss caused by spatial noise and/or temporal noise.

Spatial noise, caused for example by occlusion or environmental noise while each display frame of the image sequence is being captured, may result in mis-sampling of a relatively small portion of each display frame.

Temporal noise can cause one or more display frames to be incorrectly sampled or missed altogether, known as 'dropped frames'. As a result, temporal noise results in much greater data loss or corruption since none of the data in a dropped frame is reliable.

Consider a display refreshing at D Hertz (Hz), containing encoded data animating at C Hz. The camera frame rate is R Hz. The following error cases may arise:—

Case (a): Dropped Frames.

The Nyquist limits of the display and camera are D/2 and R/2 respectively. If C>D/2, D>R/2, or C>R/2 then it is likely that the camera will fail to image a subset of frames, i.e. frames will be "dropped".

The frequency of frame dropping is proportional to C/D, D/R and C/R but in practice C/R is the significant factor on typical equipment. Frames may also be dropped due to external factors such as misregistration of an encoded image or the environment (e.g. disruption of the line of sight between display and camera).

Case (b): Partial Refresh.

If a (raster) video display is refreshed at D Hz from top to bottom by a scanline sweep, it is possible that, at the instant when the camera samples the image, the display is only partially refreshed i.e. half the image data displayed is from the previous frame, and half is from the current (new) frame. For practical purposes, the rate at which this phenomenon occurs is proportional to the size of the image frame on the screen (typically affecting approximately 1% of frames), with insignificant correlation to D and R on typical equipment.

Case (c) Garbled Frame.

Occasionally, displayed frames will become garbled e.g. due to the camera sampling its image in the 'idle' (dim) phase of the display refresh cycle, or due to environmental factors. The rate of this phenomenon is typically constant and independent of D, R and C.

The problem of data loss is significant because if a receiving party fails to decode a single frame in a continually transmitted cycle of 'n' independent frames, a user incurs a time penalty of up to 'n' frames while waiting for a dropped frame to be repeated. This is disadvantageous because users desire brief interaction times when wishing to receive an image sequence.

DESCRIPTION OF EMBODIMENTS OF THE INVENTION

According to one embodiment of the present invention there is provided a method of generating a sequence of display frames, for display on a display device, derived from a data string which is encoded to include error correction in order to enable recreation of the data string at a receiving device, the method comprising the steps of dividing the data string to be encoded into a plurality of source segments, encoding the plurality of source segments to generate a plurality of codewords, each codeword comprising a plurality of codeword bits, and positioning codeword bits in the sequence of frames.

This method advantageously provides protection against data loss caused by temporal noise which may result in display frames being dropped completely, lost through partial refresh or garbled. Furthermore, this method ensures that the time taken to capture the encoded data is kept to a minimum without the need to either wait for a nominal 'start' of the sequence or to wait for 'dropped' frames to be recaptured.

In addition, no header data relating to the number of frames or sequence numbers of the frames needs to be included in the data to be transmitted. Header data, such as this, creates a storage overhead and reduces the amount of data that can be sent with each frame. Furthermore, typically header data is considered to be more important or critical to the decoding process, and as such, the loss of this data results in poor performance, since the image capture device would need to wait for that data to be sent again before the decoding process could begin.

Each bit may be positioned in a display frame such that the bits of a codeword occupy the same relative position within a plurality of display frames through the sequence.

Conveniently, the method may further comprise allocating each codeword bit a position in a three-dimensional matrix of cells, the three-dimensional matrix comprising a first planar axis corresponding to rows of cells, a second planar axis corresponding to columns of cells, and a longitudinal axis, which is perpendicular to the first and second planar axes, corresponding to the sequence of display frames, each display frame comprising a grid of cells arranged in rows and columns, wherein the codeword bits of each codeword are positioned along the longitudinal axis of the three-dimensional matrix.

Suitably, the method may further comprise assigning a position within a data region of each display frame to a codeword bit, further encoding bits within the data region of each display frame to generate spatial error correction bits, and allocating the generated spatial error correction bits positions within a parity region of each display frame, the data and parity regions being distinct regions in the display frame. Arrangement of the data and parity regions is the same through all frames of a given sequence. Different sequences may have different arrangements of parity and data regions with the sequence of frames.

The data regions typically comprise codeword bits from more than one codeword. In particular, each bit in a data region may correspond to a different codeword.

As such, the data string may advantageously be protected from data loss caused by temporal noise (caused by dropped frames) and spatial noise (caused by environmental noise).

The encoding step may suitably comprise selecting a suitable codeword from a plurality of codewords stored in a mappings table on the basis of each of the source segments.

Optionally, the encoding step may comprise selecting a suitable mappings table from a plurality of mappings tables on the basis of the number of bits in the source segment.

Typically, the encoding step may comprise selecting a suitable mappings table from a plurality of mappings tables on the basis of a temporal error correction parameter which relates to a minimum Hamming distance between codewords within each mappings table.

Selection of a mappings table on the basis of the minimum Hamming distance provides for the level or degree of temporal error correction to be adjusted, since a mappings table with a minimum Hamming distance of n provides for correction of (n-1) errors within each codeword.

Conveniently, the method may further comprise configuring a level of error correction on the basis of user selectable options, wherein the configuring step generates the temporal error correction parameter.

Typically, the dividing step comprises dividing the data string into source segments of bit length k.

Optionally, the method may further comprise configuring a level of error correction on the basis of user selectable options, the configuring step comprising determining the value of k.

Suitably, the method may further comprise selecting a first user selectable option relating to the display frame area of the display device displaying the sequence of frames.

The method may optionally further comprise selecting a second user selectable option relating to the frame rate of the display frames within the sequence of display frames.

Typically, the allocating step may comprise allocating the codewords positions within the data region of the three-dimensional matrix in a pre-determined sequence in order to enable decoding of the three-dimensional matrix by a decoder following the pre-determined sequence.

In one embodiment, the method may further comprise scrambling the bits positioned in words within the data string to be decoded using a pseudo-random number selected from a sequence of pseudo-random numbers. A word being a section of the data string being of a fixed, known length.

Suitably, the selected pseudo-random number may be determined from the position of the display frame within the sequence of display frames.

In another embodiment, the method may further comprise scrambling the bits positioned in the cells of a display frame using a pseudo-random number selected from a sequence of pseudo-random numbers.

Conveniently, the selected pseudo-random number may be determined from the position of the display frame within the sequence of display frames.

In an alternative embodiment, the method may further comprise scrambling the bits positioned in the cells of each codeword using a pseudo-random number selected from a sequence of pseudo-random numbers.

Suitably, the selected pseudo-random number may be determined from the position of the codeword within a sequence of codewords. The sequence of codewords relates to the order in which the codewords are positioned in the three-dimensional matrix, which is related to the data string being divided into source segments.

Typically, the method may further comprise determining sequencing information for each display frame in the sequence of display frames; and adding sequencing information bits related to the sequencing information to monitor flags within sequence of display frames. Each monitor flag being capable of moving between a first state and a second state.

Conveniently, the method may further comprise rendering the bits within the cells of the three-dimensional matrix into a plurality of grid patterns to be displayed in the sequence of display frames.

According to another embodiment of the present invention there is provided a method of decoding encoded data from a sequence of display frames, the method comprising receiving the sequence of display frames, identifying a plurality of codewords from the sequence of display frames, representative of the encoded data, the plurality of codewords comprising a plurality of bits and the identifying step comprises identifying error bits within each codeword, and decoding each codeword to retrieve a decoded data string from the sequence of frames, the decoding step comprising compensating for the error bits in dependence on the position of the error bits within the codeword and the remaining bits of the codeword. The remaining bits of the codeword relating to non-error bits or error-free bits which are positioned in display frames which have been correctly received and not 'dropped'.

Typically, each bit of the codeword may be positioned in a display frame such that the bits of the codeword occupy the same relative position within a plurality of display frames through the sequence.

Conveniently, each codeword bit may be positioned in a three-dimensional matrix of cells, the three-dimensional matrix comprising a first planar axis corresponding to rows of cells, a second planar axis corresponding to columns of cells, and a longitudinal axis, which is perpendicular to the first and second planar axes, corresponding to the sequence of display frames, each display frame comprising a grid of cells arranged in rows and columns, wherein the codeword bits of each codeword are positioned along the longitudinal axis of the three-dimensional matrix such that the codewords may be retrieved from the three-dimensional matrix along that longitudinal axis.

Typically, the sequence of frames may comprise sequencing information and the identifying step comprises determining from the sequencing information whether any of the frames were not received.

The sequencing information advantageously enables detection of 'dropped' frames. As described above, the dropped frames may not be received at all or may be corrupt due to partial refresh occurring or being garbled. The term 'error bits' refers both to bits which have been corrupted and bits which have not been received, i.e. due to dropped frames.

Suitably, the method may further comprise determining the sequencing information for each display frame.

Conveniently, the method may further comprise reordering the received sequence of display frames in accordance with the sequencing information.

This advantageously means that the sequence may be received out of order but that the correct order of the frames can be recreated. For example, a five frame sequence numbered 1 to 5 may be received [3, 4, 5, 1, 2] and re-ordered in to the correct sequence [1, 2, 3, 4, 5].

Typically, each display frame includes a data region comprising a plurality of codeword bits, and a parity region comprising a plurality of spatial error correction bits, the method further comprising: correcting, for each display frame, the codeword bits within the data region on the basis of the spatial error correction bits within the parity region, wherein the compensation of codewords in the decoding step within the sequence is carried out after the spatially correcting step.

The data regions typically comprise codeword bits from more than one codeword. In particular, each bit in a data region may correspond to a different codeword.

In addition, prior to receiving the complete sequence and reordering, it is possible that some useful information may be gathered from the frames as they are received. In particular, where each frame comprises the plurality of spatial error correction bits, the correcting step may be carried out before the whole sequence is received. This is highly advantageous because the total decoding time may be reduced as it means that useful information regarding the sequence can be gathered from the first received frame without having to wait for the notional 'start' frame.

Optionally, the decoding step may comprise comparing the remaining bits of a codeword with corresponding bits of a plurality of codewords stored in a mappings table and identifying a correct codeword corresponding to a source segment of the decoded data string.

Alternatively, the decoding step may comprise comparing the error free bits of a codeword with corresponding bits of a plurality of codewords stored in a mappings table and identifying a source segment of the decoded data string.

Suitably, the decoding step may comprise selecting a suitable mappings table from a plurality of mappings tables on the basis of the number of bits in the codewords.

Typically, each one of the plurality of mappings tables is used in turn to verify and decode the codewords until a mappings table is determined to be suitable. In this sense, a mappings table is determined to be suitable if substantially all of the codewords received can be identified from the codewords stored in that mappings table (irrespective of error bits: the mappings table being unsuitable if the codewords are not identifiable). The different minimum Hamming distances of the plurality of mappings tables ensures that only the correct codewords are identifiable from a suitable mappings table.

In one embodiment, the method may further comprise descrambling the bits of received display frames using a pseudo-random number selected from a sequence of pseudo-random numbers.

Typically, the selected pseudo-random number may be determined from the position of a word within the decoded data string. A word being a section of the data string being of a fixed, known length.

Optionally, the selected pseudo-random number may be determined from the position of the display frame within the sequence of display frames. The position of the display frame being in reference to at least one other frame in the sequence, i.e. in relation to a start/end frame.

In an alternative embodiment, the method may further comprise descrambling the bits of each codeword using a pseudo-random number selected from a sequence of pseudo-random numbers.

Suitably, the selected pseudo-random number may be determined from the position of the codeword within a sequence of codewords. The sequence of codewords relates to the order in which the codewords are positioned in the three-dimensional matrix. The order in which the codewords are identified and retrieved from the three-dimensional matrix corresponds to the order that the codewords are positioned in the three-dimensional matrix.

Conveniently, the decoding step may further comprise concatenating the source segments to complete the decoded data string.

According to a further aspect of the present invention there is provided an encoder for encoding a data string within a sequence of display frames for display on a display device, the sequence being encoded to include error correction in order to enable recreation of the data string at a receiving device, the encoder comprising: a data string divider arranged to divide the data string to be encoded into a plurality of source segments; an encoder arranged to encode the plurality of source segments to generate a plurality of codewords, each codeword comprising a plurality of codeword bits; and a codeword positioning means arranged to position the codewords, wherein the codeword bits are positioned through the sequence of frames.

Conveniently, the codeword positioning means may be arranged to allocate each codeword bit a position in a three-dimensional matrix of cells, the three-dimensional matrix comprising a first planar axis corresponding to rows of cells, a second planar axis corresponding to columns of cells, and a longitudinal axis, which is perpendicular to the first and second planar axes, corresponding to the sequence of display frames, each display frame comprising a grid of cells arranged in rows and columns, wherein the codeword bits are positioned, along the longitudinal axis of the three-dimensional matrix.

According to a further aspect of the present invention there is provided a display system comprising such an encoder and a display device in communication with the encoder.

According to a further aspect of the present invention there is provided a decoder for decoding encoded data from a sequence of display frames, the decoder comprising a receiver arrangement for receiving the sequence of display frames, a codeword locator arranged to identify from the sequence of display frames a plurality of codewords, representative of the encoded data, the plurality of codewords comprising a plurality of bits, each bit of a codeword being positioned in a display frame such that the bits of the codeword occupy the same relative position within a plurality of display frames through the sequence, and a codeword decoder means arranged to decode each codeword to retrieve a decoded data string corresponding to the encoded data from the sequence of frames, wherein the codeword locator is arranged to identify error bits within each codeword, and the decoding means is arranged to compensate for the error bits in dependence on the error-free bits in the codewords and the position of the error bits within the codeword.

According to a further aspect of the present invention there is provided a content capture system comprising a content capture device and a decoder such as that described above.

According to yet another aspect of the present invention there is provided a mobile telecommunications device (such as a mobile phone) that comprises a content capture system such as that described above.

The invention may also be expressed as a carrier medium comprising a computer program to implement the methods according to the first and second embodiments of the invention.

Therefore, according to a further embodiment of the present invention there is provided a carrier medium for controlling a computer, processor or mobile telecommunications device to generate a sequence of display frames, for display on a display device, derived from a data string which is encoded to include error correction in order to enable recreation of the data string at a receiving device, the method comprising the steps of dividing the data string to be encoded into a plurality of source segments, encoding the plurality of source segments to generate a plurality of codewords, each codeword comprising a plurality of codeword bits, and positioning codeword bits in the sequence of frames.

According to a yet further embodiment of the present invention there is provided a carrier medium for controlling a computer, processor or camera-equipped mobile telecommunications device to decode encoded data from a sequence of display frames, the method comprising receiving the sequence of display frames, identifying a plurality of codewords from the sequence of display frames, representative of the encoded data, the plurality of codewords comprising a plurality of bits and the identifying step comprising identifying error bits within each codeword, and decoding each codeword to retrieve a decoded data string from the sequence of frames, the decoding step comprising compensating for the error bits in dependence on the position of the error bits within the codeword and the remaining bits of the codeword. The remaining bits of the codeword relate to non-error bits or error-free bits which are positioned in display frames which have been correctly received and not 'dropped'.

BRIEF DESCRIPTION OF DRAWINGS

Preferred embodiments of the invention will now be described, by way of example only, with reference to the accompanying drawings in which.

DETAILED DESCRIPTION

Figure 1:
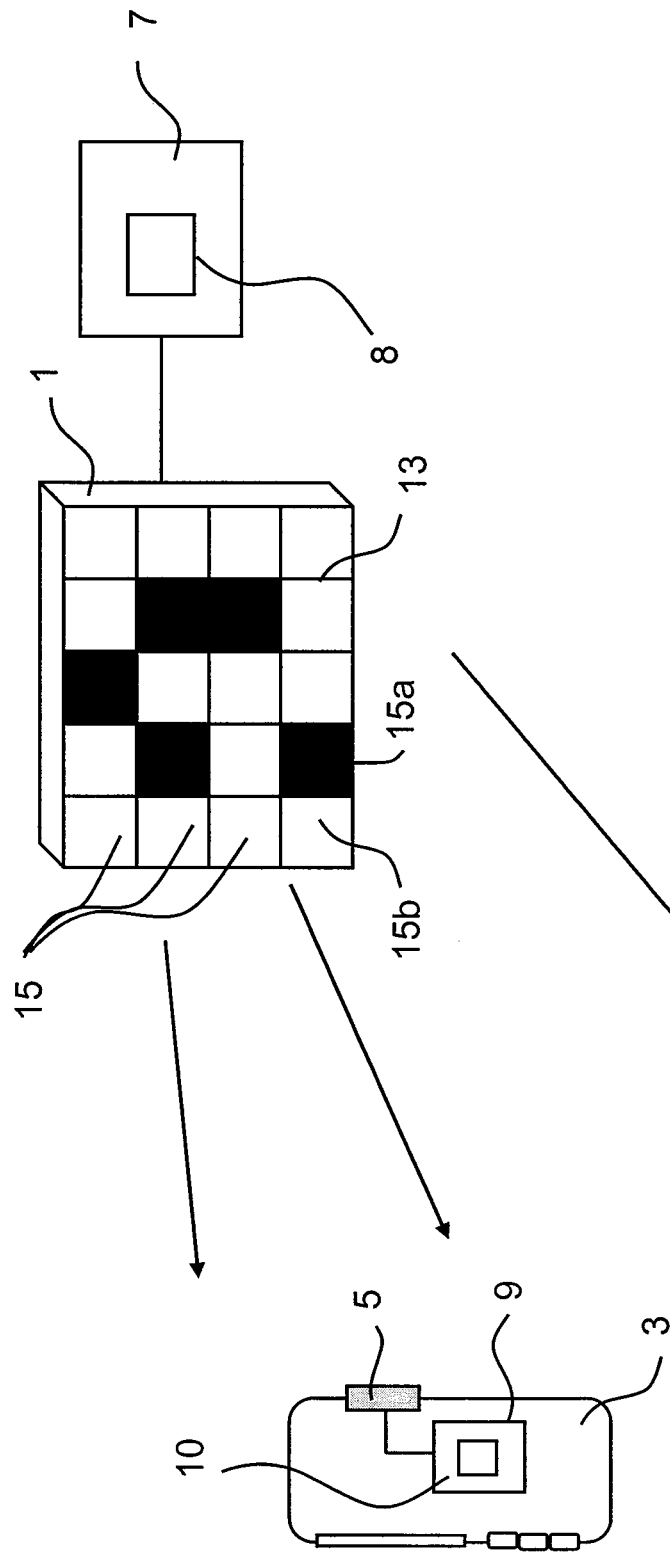
FIG. 1 is a schematic system diagram showing an image display, a content encoder and an image capture device in accordance with an embodiment of the present invention.

FIG. 1 shows an image display device 1 and an image capture device 3 in accordance with an embodiment of the present invention.

The image display device 1 may, for example, be a computer or television screen, a digital poster display or any other type of video display screen.

The image capture device 3 depicted in the present embodiment is a mobile telecommunications device comprising a camera 5. However, any image capture device capable of receiving and recording a visual image may be used.

The image display device 1 is controlled by a content encoder 7 which comprises a processor 8. The content encoder 7 is arranged, via the processor 8, to encode content that is input into the content encoder 7 into an image for display by the image display device 1. The content encoder may be a dedicated PC or may be a computer server or other distributed terminal that is in communication with the image display device via the Internet (or other network).

The image capture device 3 comprises the camera 5 and also a content decoder 9. The content decoder comprises a processor 10. The content decoder 9 is arranged, via its processor 10, to decode content from the images captured by the camera 5.

As shown in FIG. 1, content is represented by a rectangular pattern of light displayed on the image display device 1.

In FIG. 1, the display device 1 is displaying a grid 13 of cell regions 15. Cell regions are, in this embodiment of the invention, capable of alternating between a first state 15a and a second state 15b.

Cells in the first state may, for example, be of a higher luminosity than cells in the second state. In FIG. 1, however, cells in the first state are indicated by shaded/dark cells 15a. Cells in the second state are indicated by unshaded/light cells 15b.

Since cells 15 may be in one of two different states the pattern/grid 13 is capable of encoding binary data.

It is noted that although FIG. 1 depicts cells 15 as being either shaded (15a) or unshaded (15b), the data may also be encoded within an arbitrary image by raising or lowering the luminosity of grid cells within the image.

In addition, the data may be encoded as a barcode, for example a QR code or datamatrix.

Figure 2:
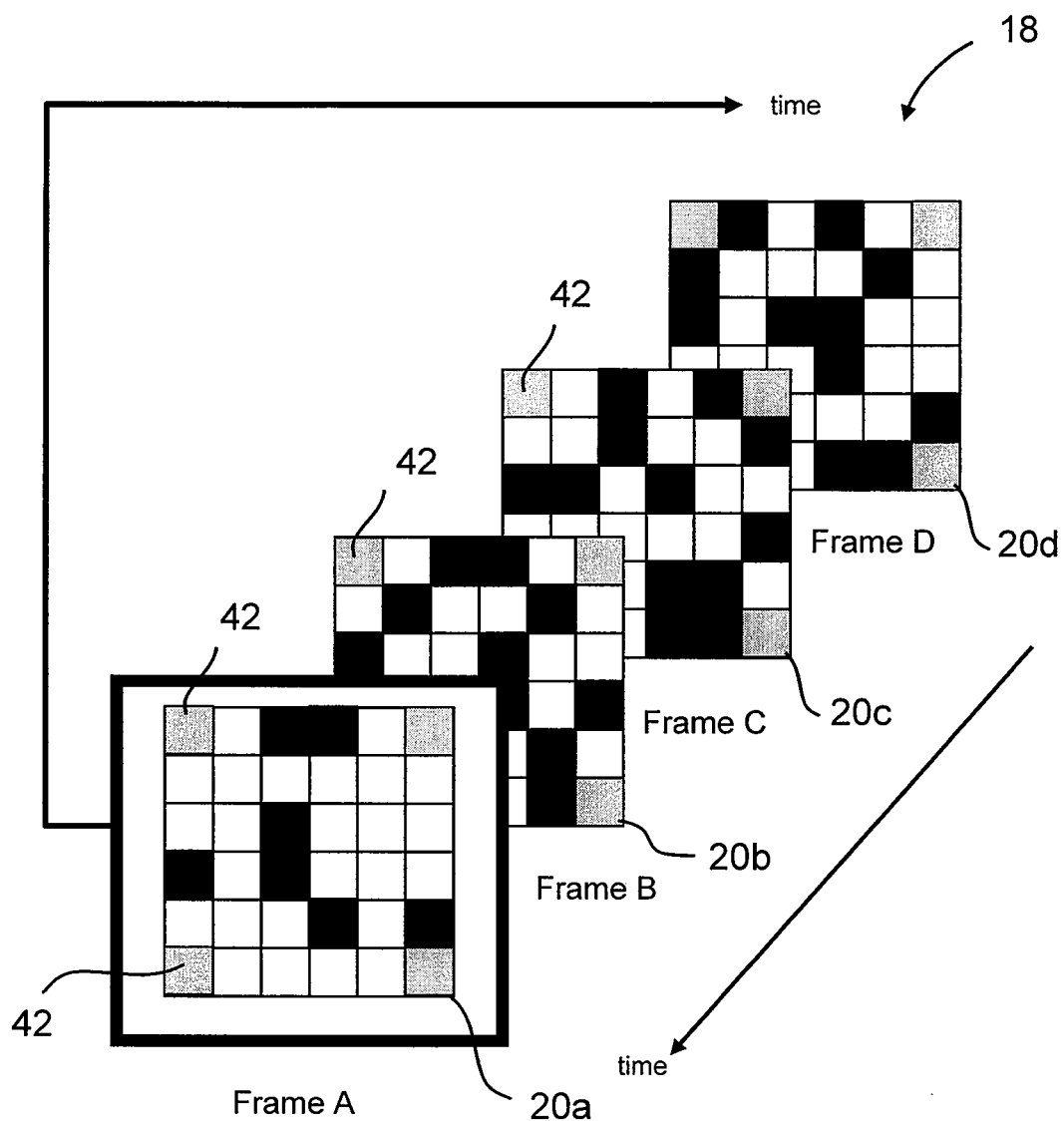
FIG. 2 is a schematic sequence of display frames illustrating examples of the display frames displayed by the display device of FIG. 1.

In cases where it is desired to send content that exceeds the ability of a single grid 13 to encode all the data, a changing grid pattern may be used to convey information from the display device 1 to the image capture device 3. Such a changing grid pattern is depicted in FIG. 2 as a sequence 18 of four display frames (Frame A, Frame B, Frame C and Frame D). In this sense, the data may be encoded as a sequence of barcodes.

The information contained within the sequence is encoded such that it comprises an error correction (EC) overhead. As such, the sequence of display frames is referred to as a code sequence.

Each of the display frames (A, B, C and D) comprises a different two dimensional grid pattern (20a, 20b, 20c, 20d) which are displayed in a continuous cycle by the image display device 1, such that the display frame changes with time (t).

In use, noise in the transmission channel between the display device 1 and the image capture device 3 is likely to introduce transmission errors into images captured by the camera 5.

In particular, sporadic environmental noise (spatial noise caused by display speckle noise or occlusion) can cause small portions of the data within a frame to be mis-sampled (i.e. interpreted as '1's instead of '0's and vice versa). In the case of spatial noise, a relatively small fraction of the data is corrupted.

Temporal noise can cause one or more frames to be incorrectly sampled or missed altogether resulting in much greater data loss or corruption. Frames which are not sampled correctly are termed 'dropped frames' and this may occur at times where the display of a frame coincides with a refresh cycle of the displaying screen, resulting in part or none of the data relating to that frame being sampled correctly. In addition, frames may be garbled due to movement of the scanner/reader at the time that frame is being displayed.

In the event of a dropped frame, none of the data received for that field is reliable. It is possible to detect dropped fields, as described in detail below, and information relating to which frames have been dropped is used by the content decoder in order to correctly decode a received code sequence.

An encoding process in accordance with an embodiment of the present invention provides a mechanism for combining the data to be transmitted with an error correction overhead in order to mitigate the problems with noise. More specifically, additional bits are included in the code sequence to provide for error correction of the complete code sequence at the content decoder.

The type of error correction may include spatial error correction and/or temporal error correction.

Spatial error correction may be achieved by dividing each grid into a data region and a parity region. The data region is reserved for binary elements relating to raw data and the parity region contains error correction words which enable reconstruction of the bits within the data region should they become corrupted due to spatial noise.

The data and parity regions are typically placed within identical positions in all frames, and the error correction words in any particular frame may only be used to reconstruct corrupt data within that frame. As such, this form of error correction is useful for guarding against spatial noise but is not robust to temporal noise.

To mitigate data corruption caused by temporal noise a temporal error correction overhead is included within a plurality of cells throughout the sequence of frames. Spatial error correction may also be applied to each individual frame to provide a spatio-temporal encoding and decoding scheme for data transfer, which is robust to spatial and temporal noise.

Figure 3:
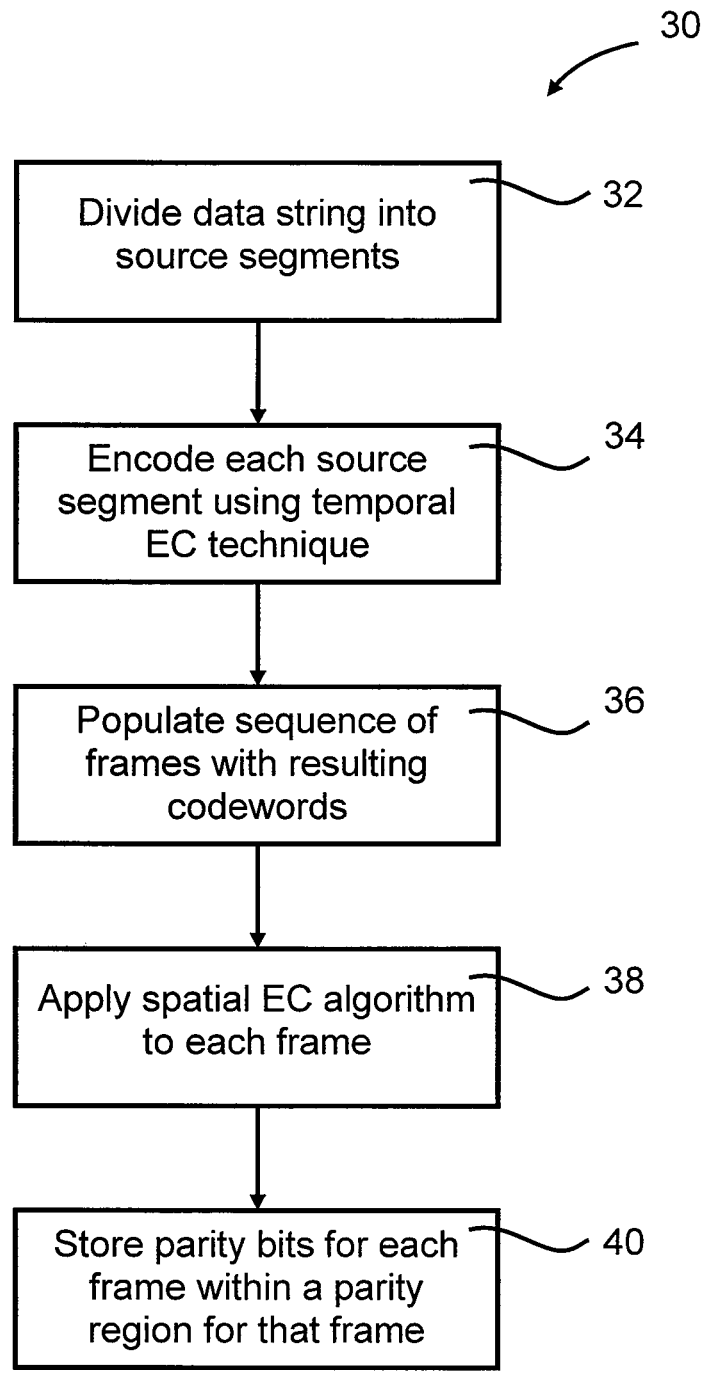
FIG. 3 is a flowchart of the method steps of an encoding process according to one embodiment of the present invention.

A flowchart 30 of an exemplary method of temporal and spatial EC encoding is shown in FIG. 3.

The data to be encoded may typically be textual data relating to an intended message, for example a URL of a website which a user may wish to be directed to for further information or purchase options. The encoded data may then be displayed in a repeating sequence to be captured by an image capture device of the user.

In one example, the code sequence displayed may relate to a product for sale i.e. a music track, book or CD, and the code sequence may direct the user to the URL where that product may be purchased online. In another example, the code sequence may contain media information, e.g. an image file, such as a thumbnail image, or an audio file, such as a sound bite. It is to be appreciated that the code sequence may contain both textual data and media information.

Referring to the EC method of FIG. 3, the data to be encoded within the code sequence may initially be converted into it's binary equivalent and formatted as a data string. This data string is divided, at step 32, into source segments of a set length, for example 3 bits. The source segments are encoded, at step 34, using a temporal EC technique, into codewords (CWs) of a set length, for example 4 bits. One such EC technique comprises identifying an associated codeword on the basis of a source segment from a source-segment-to-codeword mappings table, which comprises a plurality of codewords that are designed to be a minimum Hamming distance from each of the other codewords in the mappings table.

The bits of the codewords are used, at step 36, to populate the cells of the code sequence. The code sequence, corresponding to a plurality of display frames, can be considered to be a three-dimensional (3D) matrix. Each display frame comprises a grid of cells arranged in rows and columns. The rows of cells correspond to a first planar axis, and the rows of columns correspond to a second planar axis.

Each of the display frames in the sequence can be considered to be positioned along a longitudinal axis, which is perpendicular to the first and second planar axes. The bits of each codeword are positioned in cells, at the same row/column position, along the longitudinal axis. In other words, each bit of a codeword is placed in the same cell locations through the 3D-matrix, i.e. at (x, y, t) where x is a particular column, y is a particular row, and t equals the number of a display frame in the sequence of display frames, which varies over time as each frame is displayed in turn. As such, codewords are positioned through the 3D-matrix and, in the present embodiment, no two bits of a codeword appear in cells of the same frame.

When the complete data string has been divided into source segments and converted into codewords, which are placed in data cells within data regions of the 3D-matrix, a spatial EC algorithm is applied, at step 38, to the data within the data regions of each frame in order to provide spatial error correction.

Applying the spatial EC algorithm at step 38 yields error correction bits or 'parity bits' which are used when the code sequence is decoded to correct any corrupted bits within each frame caused by spatial noise. The parity bits yielded in step 38 for each frame are stored, at step 40, within the parity region for that frame.

The size and position of the data and parity regions are the same for each frame throughout the sequence. However, it is to be appreciated that the size and position of the data and parity regions may vary depending on the particular encoding configuration being used. Different encoding configurations, described in detail below, allow for configuration of the trade-off between spatial error correction and temporal error correction.

When the parity bits have been stored for each frame, the content of the code sequence is complete, and is ready to be output. Prior to output, transmission overhead data, in the form of 'monitor flags', is added to each frame. Monitor flags 42, shown in FIG. 2 as grey cells, are added to each frame to signify the start and end frames, and also provide additional information which may be used in the detection of dropped frames. The monitor cells in FIG. 2 are grey for illustration purposes only. As described below, these cells are shaded or unshaded as required to provide for detection of the type of frame being displayed.

Figure 4:
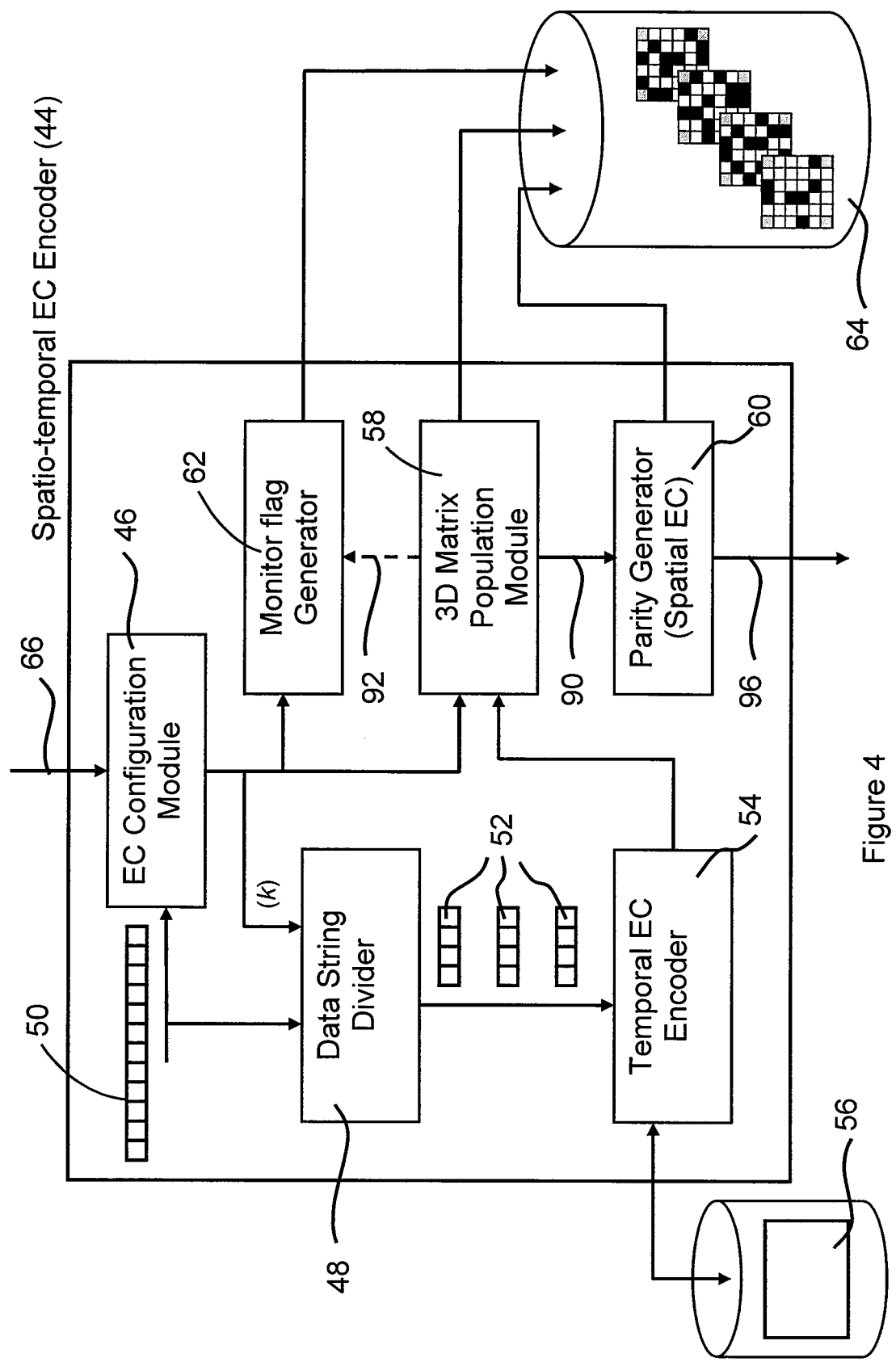
FIG. 4 is a schematic block diagram of the functional components of an encoder arranged to carry out the method steps of FIG. 3, and a library of mappings tables.

FIG. 4 shows a schematic block diagram of functional blocks of a spatio-temporal error correction (STEC) encoder 44 which is an exemplary method of implementing the steps shown in FIG. 3. As shown, the STEC encoder 44 comprises: an EC configuration module 46, for enabling configuration of the STEC encoder 44, including determining suitable dimensions for each 3D-matrix; a data string divider 48, for dividing a raw data binary string 50 input to the STEC encoder 44 into source segments 52; a temporal EC encoder 54, for selecting an appropriate codeword from a library of source-segment-to-codeword mappings tables 56 for each source segment 52; and a 3D-matrix population module 58, for populating memory cells of a 3D-matrix with the codewords.

The STEC encoder 44 also comprises: a parity generator 60 for generating parity bits, for each frame in the 3D-matrix, in order to provide for spatial EC of data in each frame, and adding the generated parity bits to a parity region of each corresponding frame; and a monitor flag generator 62, for generating the monitor flags 42 (sequence data) which are applied to the 3D-matrix in order to enable identification, at a image capture device 3, of start and end frames, and dropped frames.

The STEC encoder 44 has access to the library of source-segment-to-codeword mappings tables 56, and also has access to a data store 64 for storing the 3D-matrix.

The EC configuration module 46 is arranged to determine the overall dimensions of the 3D-matrix and to enable a user to configure a balance between temporal EC and spatial error correction, i.e. configuring a level of error correction on the basis of user selectable options. An advantage of enabling such configuration is that it is a very flexible method of tailoring EC requirements to a particular application or transmission channel.

The EC configuration module 46 takes as inputs the binary string 50 which is to be encoded, and user configurable options 66 relating to the desired EC requirements. The dimensions of the 3D-matrix are determined on the basis of the length of the binary string 50 to be encoded and on the user configurable options 66.

Factors which may be taken into consideration regarding the EC requirements are the physical dimensions of the frame being displayed and the frame rate. These factors corresponding to user selectable options.

The physical dimensions of the frame being displayed are important because a relatively small frame size will be more susceptible to spatial errors than a large frame, i.e. an anomaly causing a spatial error may corrupt data in more than one cell in a smaller frame than a larger frame. In addition, a fast frame rate will be more susceptible to temporal errors relating to dropped frames than a slow frame rate because the longer each frame in the code sequence is displayed, the more time is available for the image capture device to sample the data correctly.

In addition, a user setting up data to be encoded may also make an assessment of the robustness of the transmission channel, i.e. an assessment of the likelihood of certain types of noise/errors occurring in a particular transmission channel. This may relate to whether the display device and the image capture device are separated by a glass or similar partition, and also the likely distance between the display device and the image capture device (i.e. based on a minimum distance caused by a barrier such as a shop window.

In particular, a glass or similar partition may result in reflections/artifacts in the shop window, which could cause corruption of localised regions of bits in each frame.

Furthermore, the distance between the image capture device and the display device is also important because it has a bearing on the number of pixels the code sequence frame occupies in the image captured by the image capture device. In effect, this has a bearing on the effective resolution of the image capture device's resolution, i.e. moving an image capture device further away from the displayed code sequence, whilst keeping the display device's and the image capture device's resolution constant would probably increase spatial noise meaning a requirement for increased spatial EC because the code sequence frame will occupy fewer pixels in the captured image(s). As such this is akin to effectively reducing the resolution of the image capture device.

However, changing the distance between the image capture device and the display device may also effect the sharpness of the captured image(s). This is particularly true of all fixed-focus image capture devices, which may go out of focus if the image capture device is too close or too far away from the display device.

In one embodiment, a user, setting up data to be encoded, is permitted to select or enter details regarding each of the EC requirements and the EC configuration module uses a suitable algorithm to determine a set of EC parameters. In another embodiment, a user selects one of a plurality of preset EC parameter sets, which provide a desired balance between the EC requirements.

The EC parameters comprise: the number of bits (bit-length k) in each source segment (for use by the data string divider); the dimensions of the required 3D-matrix (for use by the 3D-matrix population module and (directly or indirectly) the monitor flag generator); and a temporal error correction parameter (which is used by the temporal EC encoder 54 to determine the level of temporal EC required).

Any of the above parameters may be user selectable to configure the level of EC.

The dimensions of the 3D-matrix may be determined in relation to one or more of the following factors, including but not limited to, the number of bits in the data string to be encoded, the level of temporal error correction required, based on the robustness of the transmission channel to temporal noise, the screen resolution of the display device, and the number of bits in any one frame which must be reserved for monitor flags and spatial error correction bits. In other words, the complete data string may be contained within the code sequence, within the confines of the number of bits/cells which can be displayed on a particular display device.

It is possible that no appropriate dimensions of the 3D-matrix exist for a particular length of data string (i.e. if the data length is a prime number). In that case, a 3D-matrix with a slightly larger than required data capacity may be used and the remainder of bits in the code sequence may be padded with zeros, i.e. binary '0's.

The data string divider 48 divides the input data string 50 into a plurality of source segments 52, each being k bits long, as determined by the EC configuration module. As shown in FIG. 4, an example data string of 12 bits is divided into 3 source segments of 4 bits long by the data string divider and each source segment is passed to the temporal EC encoder 54 in turn.

The temporal EC encoder 54 uses the received source segments 52 to look-up a corresponding codeword from the library of source-segment-to-codeword mappings tables 56.

In one embodiment, the library contains only one source-segment-to-codeword mappings table which is designed to contain codewords which are a minimum Hamming distance apart. However, typically the library contains a plurality of source-segment-to-codeword mappings tables, each of which is designed to have codewords of differing minimum Hamming distances.

There is a direct relationship between the Hamming distance and number of correctable errors in a codeword: the relationship being that when encoding data using a mappings table with a minimum Hamming distance of n, it is possible to correct n−1 errors in the received codewords. Therefore, by enabling the use of mapping tables with different Hamming differences it is possible to control the level of temporal EC.

An example mappings table, with a minimum Hamming distance of 2 is shown below.

| Source Segment | Codeword |
|---|---|
| 000 | 0001 |
| 001 | 0010 |
| 101 | 0100 |
| 011 | 0111 |
| 100 | 1000 |
| 101 | 1011 |
| 110 | 1101 |
| 111 | 1110 |

As shown, for every combination of 3-bit source segments there is an associated codeword, which is at least a Hamming distance of 2 away from every other codeword in the mappings table.

Using the example of the mappings table above, if at the content decoder a codeword, for example [1001], is received and is not found in this mappings table (a copy is also stored at the receiver) and it has been determined that the second frame was dropped, then it is deduced that the correct data is [1X01], where X represents the corrupt/unreliable data caused by the dropped second frame. Comparing the correct data with the possible codewords, the correct codeword must be [1101]. As such, the source segment must be [110].

If two or more frames were dropped causing two or more potential errors in the received codeword, it is not always possible, using the above table, to determine the correct source segment. For example, if [1XX1] is received (X again representing the unreliable data caused by dropped frames) it is impossible to determine whether the original codeword was [1011] or [1101].

A mappings table, with a larger Hamming distance than the above table, can be used to correct more errors. Therefore, source-segment-to-codeword mappings tables with different Hamming distances vary the degree to which temporal error correction can take place. However, it is to be appreciated that increasing the Hamming distance increases the number of bits in each codeword.

In any code sequence there is a finite number of cells because there is a desire to keep the time it takes to 'capture' a code sequence to a minimum. As an example, a mobile phone camera frame rate may detect ten frames per second (fps). Therefore, if a code sequence contains twenty frames it will take two seconds for a receiving party to receive the complete code sequence. The data capacity of a code sequence, therefore depends on the number of cells in each frame and the number of frames in the sequence. Increasing the number of cells containing codewords, decreases the number of cells available for spatial EC, and vice versa. As such, a balance must be struck between the degree of temporal EC and the degree of spatial EC. One way in which a balance may be achieved is through the use of error correction configuration presets, as described below.

Figure 5:
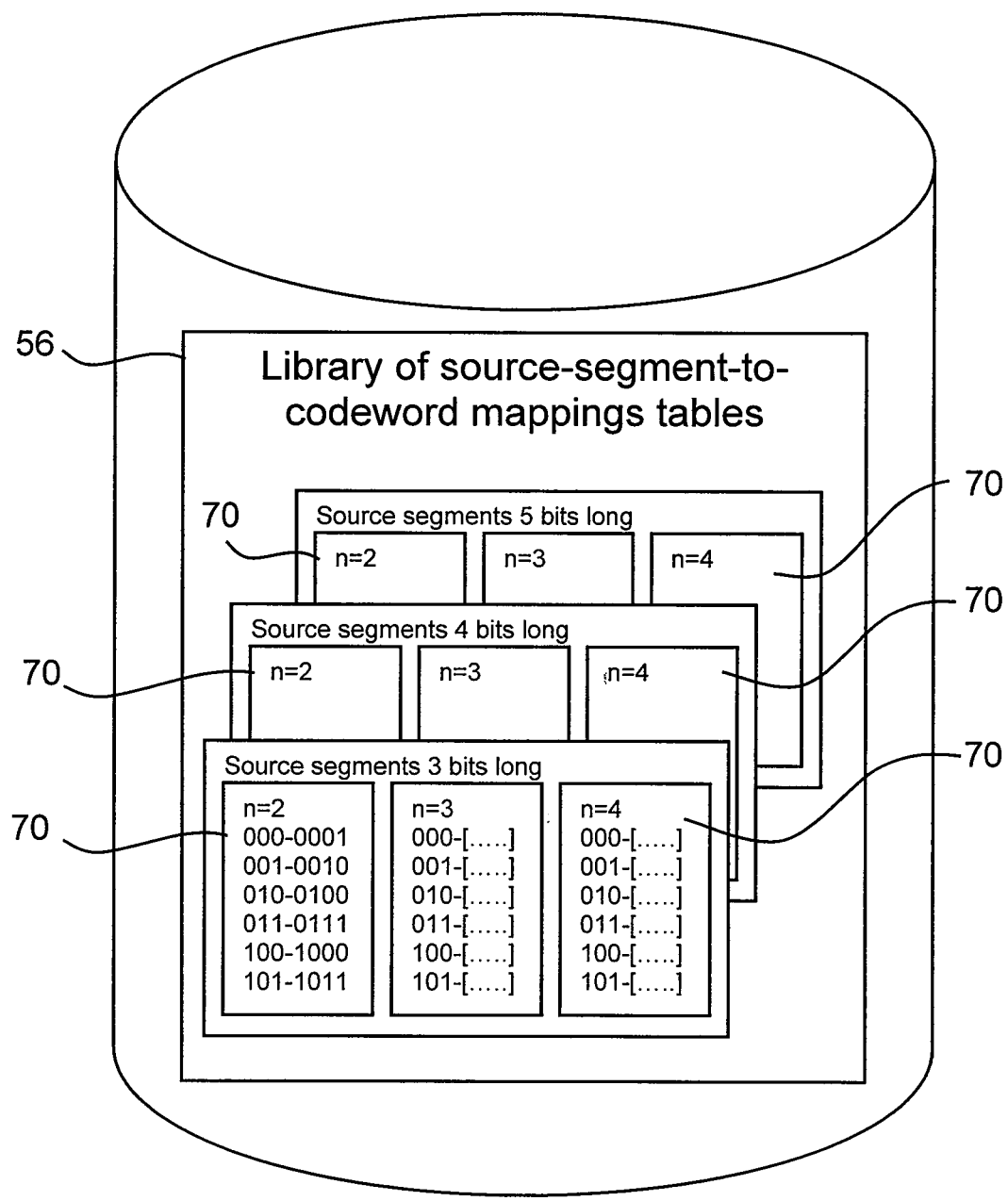
FIG. 5 is a schematic diagram of a data store containing the library of mappings tables shown in FIG. 4.

As shown in FIG. 5, the library 56 comprises a plurality of source-segment-to-codeword mappings tables 70 for varying minimum Hamming distances (e.g. n=2, 3 or 4 in FIG. 5) and also for different lengths of source segments, as this may also vary depending on EC configuration module.

The temporal error correction parameter, set by the EC configuration module, is passed to the temporal EC encoder 54 such that the temporal EC encoder 54 is arranged to use (look-up) the correct mappings table 70. The temporal error correction parameter may be an indication of which mappings table 70 to use or an indication of the minimum Hamming distance (n) required, by the EC configuration module 46, in order to achieve its goal of meeting the user configurable EC requirements. In the latter case, it is the temporal EC encoder 54 that determines which mappings table 70 to use on the basis of the required minimum Hamming distance (n) and the length of the source segments 52.

The 3D-matrix population module 58 is arranged to generate a matrix memory store of the required dimensions for a 3D-matrix, and populate memory cells of the matrix memory store with the codewords received from the temporal EC encoder 54.

In one embodiment, there may be a correlation between the number of bits in each codeword and the number of frames in the code sequence, i.e. the number of frames may be, in the present embodiment, an integer multiple of the number of bits in each codeword. For example, if a codeword is 4-bits long, then there may be 4, 8, 12, 16 etc frames in a code sequence.

In another embodiment, the number of bits in a codeword may be independent of the number of frames. In this sense, the codeword bits are placed, in a particular order, within the data regions, through the sequence of frames.

The order may be further explained using the (x, y, t) notation, where x and y represent the position of a cell in a frame, and where t represents a particular frame. In a code sequence comprising 5 frames, codewords of 7 bits may be arranged as follows:

Bit 0 of codeword 1 is placed in (1,1,1)
Bit 1 of codeword 1 is placed in (1,1,2)
Bit 2 of codeword 1 is placed in (1,1,3)
Bit 3 of codeword 1 is placed in (1,1,4)
Bit 4 of codeword 1 is placed in (1,1,5)
Bit 5 of codeword 1 is placed in (2,1,1)
Bit 6 of codeword 1 is placed in (2,1,2)
Bit 7 of codeword 1 is placed in (2,1,3)
Bit 0 of codeword 2 is placed in (2,1,4)
Bit 1 of codeword 2 is placed in (2,1,5) etc.

Figure 6:
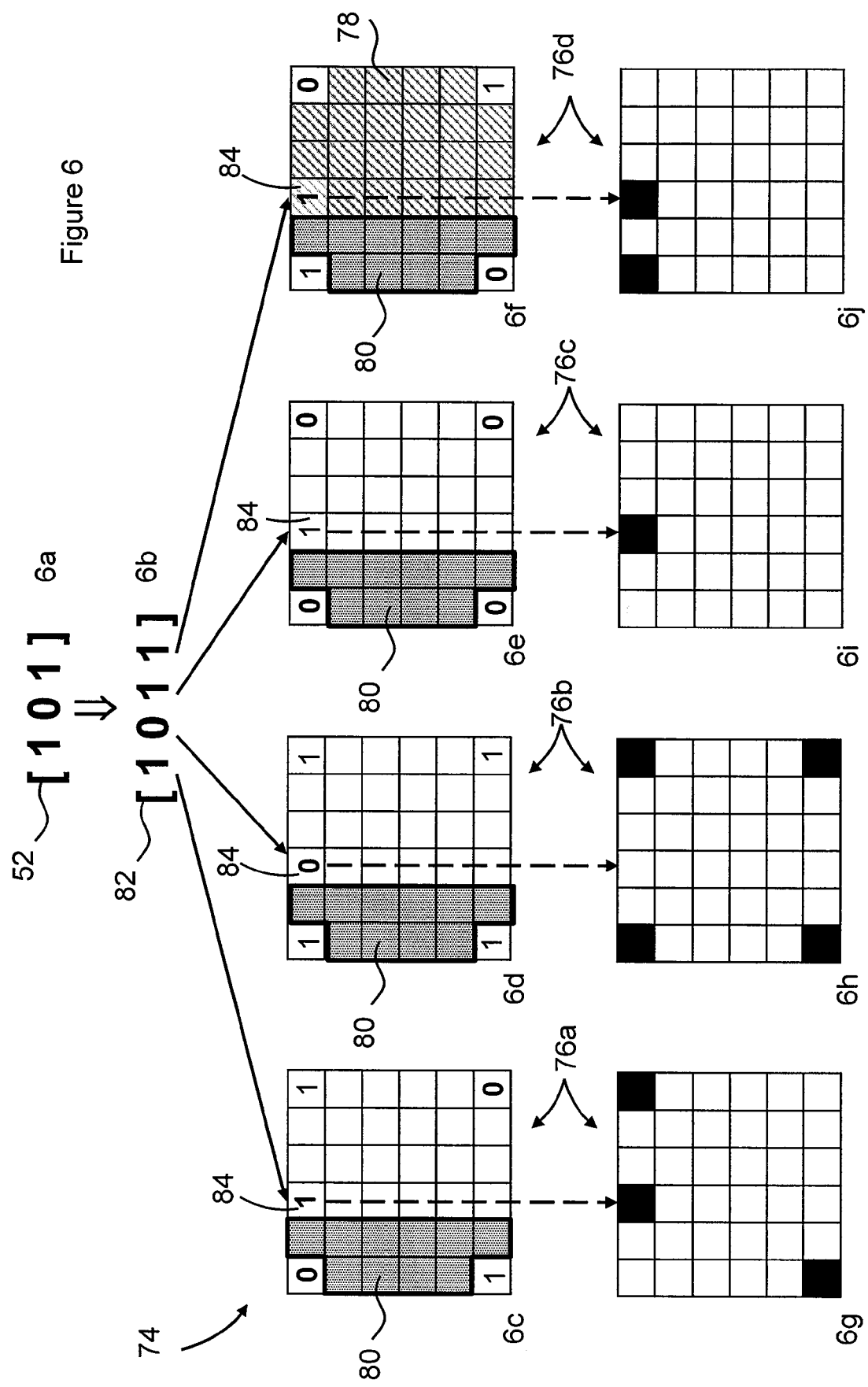
FIGS. 6a to 6j are schematic diagrams illustrating the encoding process.

A part-populated matrix 74 is shown in FIG. 6. As explained above the 3D-matrix has a plurality of frames 76 and each frame has a data region 78 (illustrated as a cross-hatched area in FIG. 6) for containing bits of codewords which relate to the source segments 52. In addition, each frame has a parity region 80 (illustrated as a dotted area in FIG. 6) for containing parity bits which are generated on the basis of the bits in the data region. In the example in FIG. 6, a source segment 52 (shown in FIG. 6b as [1 0 1]) of a data string 50 is transformed into a codeword 82 (shown in FIG. 6b as [1 0 1 1]) and the bits (binary elements) 84 of that codeword 82 are placed in the same cell location 84 (i.e. same row x and column y) in each frame. This is repeated for each codeword generated by the temporal EC encoder 54 until the data region 78 of each frame 76 has been populated.

When the data region 78 has been fully populated, a parity generation flag 90 is generated by the 3D-matrix population module 58, of FIG. 4, and is passed to the parity generator 60.

In one embodiment, the parity generator 60 generates parity bits for the bits within each data region 78 using an error correction algorithm. The error correction algorithm may be a linear code such as the Reed-Solomon code. However, it is to be appreciated that other error correction algorithms may be suitable.

The generated parity bits are assigned positions within the parity region 80 for that frame, and are stored in the corresponding memory cells.

This procedure is repeated for each frame until the parity regions 80 of each frame of the code sequence 74 are populated.

In addition to the data and parity regions 78, 80, each frame also has a monitor flag region. In the part-populated matrix 74 shown in FIG. 6, the monitor flag region occupies the four corner cells of each frame 76: the cells containing a monitor flag 42 which is indicative of the type of frame i.e. start, end, or intermediate.

The monitor flag generator 62 of FIG. 4 generates a monitor flag for each frame in the sequence to facilitate detection of start frames, end frames, duplicate frames and any frames which may have been dropped. The implementation of monitor flags for this purpose is described in more detail in co-pending GB patent application filed on 27 Jul. 2007 with the title 'An Encoder and a Decoder and Methods of Encoding and Decoding Sequence Information'.

The format of the monitor flags is not essential in the implementation of this embodiment of the invention, only that the monitor flags enable start frames, end frames, duplicate frames and dropped frames to be detected.

In addition, the monitor flags are generated by the monitor flag generator in response to being notified of the dimensions of the 3D-matrix. The monitor flag may be notified of the dimensions of the 3D-matrix directly or indirectly via the 3D matrix population module, as shown by the dashed line 92 in FIG. 4.

FIGS. 6c and 6g show a start frame 76a, FIGS. 6d and 6h show a first intermediate frame type 76b, FIGS. 6e and 6i show a second intermediate frame type 76c, and FIGS. 6f and 6j show an end frame 76d.

Code sequences of this format, comprise a start frame to identify a first frame in the code sequence and an end frame to identify the last frame in the code sequence. Each intermediate frame has the monitor flags 42 of either the first intermediate frame type 76b or the second intermediate frame type 76c.

In particular, the first and second intermediate frame types 76b, 76c are alternated such that no two adjacent frames have the same monitor flags 42. As such, if upon receiving a code sequence 74 which does contain two adjacent frames 76 having the same monitor flags 42, either there has been at least one dropped frame, or the same frame has been sampled twice.

It is easy to detect whether a frame has been sampled twice because all of the additional cells in the frame will also be substantially identical. Therefore, start frames, end frames, duplicate frames and dropped frames can be detected using this monitor flag format.

It is possible that two adjacent frames may have identical monitor flags 42 when an odd number of frames have been dropped. However, it is unlikely that more than one consecutive frames will be dropped.

As stated above, a display device may refresh at D Hertz (Hz), and may contain encoded data which is animated at C Hz, and an image capture device may sample the encoded data at a camera frame rate of R Hz. The Nyquist limits of the display and camera are D/2 and R/2 respectively, i.e. C must be lower or equal to D/2 and R/2. If operating below the Nyquist limits (e.g. displaying the encoded data at C=10 frames/second, and sampling at R 20 frames/second) usually no frames are dropped. If operating above the Nyquist limit, C is greater than D/2 or R/2 (e.g. displaying the encoded data at C=10 frames/second, and sampling at R=12 frames/second), and as such more than one frame may be dropped depending on the number of frames in the sequence. However, these dropped frames would be at well spaced intervals due to beat frequencies of the induced temporal aliasing. Furthermore, the sampling rate would need to be a significant degree lower than the display rate in order to observe more than one consecutive dropped frame.

When the data regions 78, parity regions 80 and monitor flag regions 42 are populated (i.e. all the bits within these regions have been assigned to memory cells), a matrix-complete flag 96 is generated by the parity generator 60 to signal that the complete 3D-matrix 74 has been populated and is stored within the matrix memory store, ready to be transformed or 'rendered' into a sequence of display frames 18.

Within the 3D-matrix 74 the binary elements (bits) are stored as a set of '1's and '0's and an image render module (not shown) transforms the binary '1's and '0's into a sequence of display frames 18 containing grid patterns of shaded and unshaded cells, as shown in FIGS. 6g to 6j.

In an embodiment of the present invention, prior to being rendered into the sequence of frames 18, the binary elements in each frame may be pseudo-randomly scrambled to ensure that the distribution of bits within each frame appears to be visually chaotic. This advantageously prevents a regular 'beat' pattern occurring through the sequence of frames which could cause a strobing or other effect that could result in corruption of the data within the frames. Pseudo-random scrambling also prevents the possibility of any two grid frames being identical within the code sequence, which is an important consideration as a substantially identical frame may be considered to have been sampled twice or the content decoder may consider that a second frame substantially identical to a first frame is a repetition of that first identical frame and may truncate the sequence too early.

The pseudo-random scrambling may be achieved by adding a selected pseudo-random number to sections of the data string, prior to being passed to the data string divider.

The pseudo-random scrambling may also be achieved by adding a pseudo-random number to sections of bits in the code sequence 74. One way in which this could be achieved is by adding a pseudo-random number to each row, column or other pre-defined section of each frame: using a different pseudo-random number for each section or for each frame.

Alternatively, prior to applying spatial error correction, each of the codewords may have a different pseudo-random number added to it.

The pseudo-random numbers are selected from a pre-defined sequence of numbers which is known at both the encoder 44 and decoder. Also known at the encoder and decoder is the order in which the application of the pseudo-random scrambling takes place. In this way, the encoder 44 follows a particular pattern/order to add the sequence of pseudo-random numbers to the known sequence of sections of bits (i.e. sections/words of the data string; rows, columns; or codewords etc) and the decoder follows the same pattern/order in order to subtract the correct pseudo-random numbers from each of the sections of bits. Any uniformly distributed pseudo-random number sequence may be used for this purpose.

When a matrix is complete, as indicated by the matrix complete flag 96, the image render module (not shown) takes the binary elements within the 3D-matrix 74 and translates them into a visual code sequence 18 of shaded and unshaded cells as shown in FIG. 2. For example, all binary '1's are rendered into shaded cells at appropriate positions with the frames, and all binary '0's are rendered into unshaded cells. The image render module is informed of the dimensions of the visual code sequence by the EC configuration module 46 in order to correctly carry out the task of generating the grid pattern.

In one embodiment, the visual code sequence 18 is generated and stored in a video format for subsequent display by the image display device. In another embodiment, the visual code sequence is generated as a plurality of separate image files which are displayed in turn by the image display device. In yet another embodiment, the image display device itself may contain a suitable image render module which can be used to either generate, in real-time, the sequence of frames 18 to be displayed by the image display device 1.

A decoding process in accordance with an embodiment of the present invention provides a mechanism for retrieving data from a visual code sequence 18 received by an image capture device 3. More specifically, a received code sequence including error correction is verified and corrected as necessary in order to retrieve the 'raw' data string.

Figure 7:
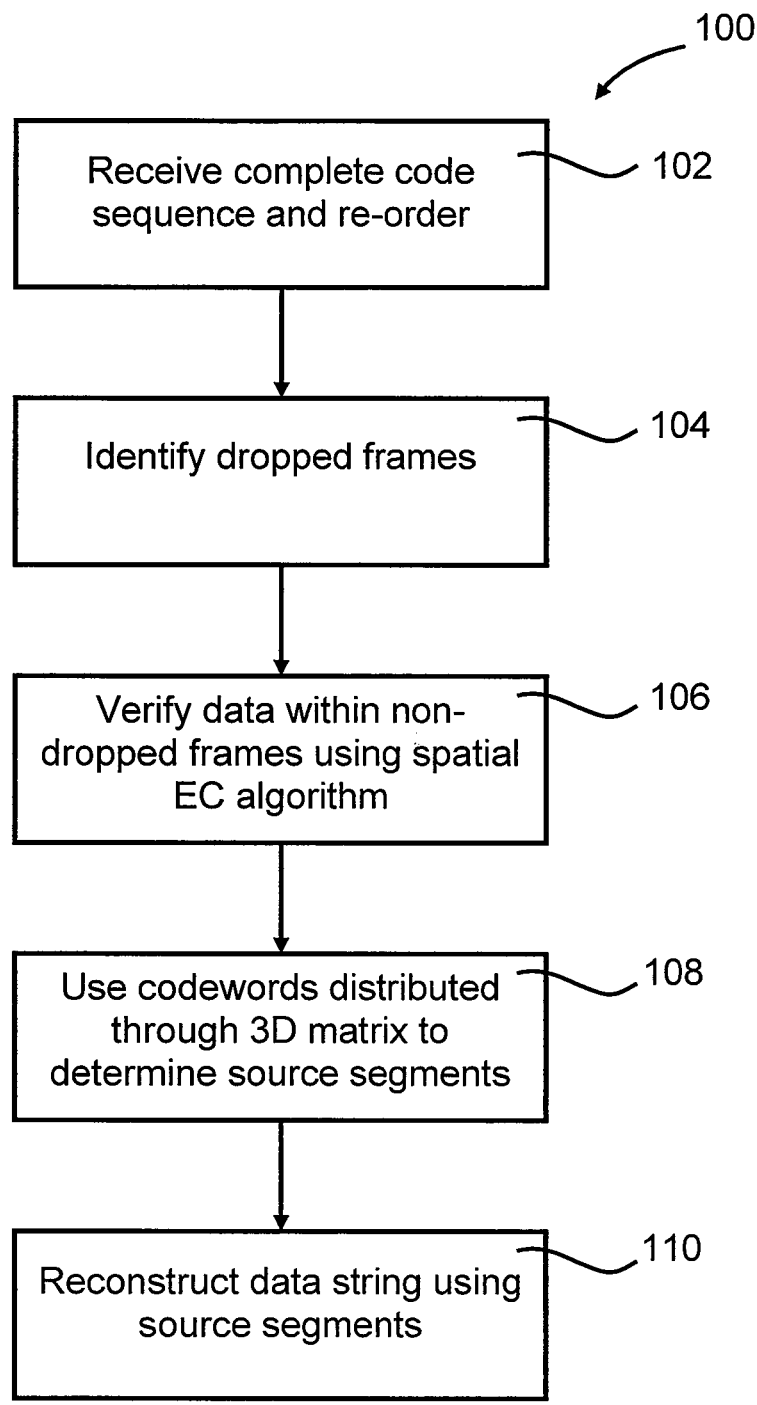
FIG. 7 is a flowchart of the method steps of a decoding process according to one embodiment of the present invention.

The visual code sequence 18 is displayed repeatedly for capture by the image capture device 3 which comprises a content decoder arranged to decode the received visual code sequence in substantially the reverse order of the operation shown in FIG. 3. A flowchart 100 of an exemplary method of temporal and spatial error correction decoding is shown in FIG. 7.

As the visual code is displayed repeatedly, the code sequence may be received in any order. For example, a five frame code sequence [1 2 3 4 5] might be received as [3 4 5 1 2]. Being able to receive the sequence in any order is advantageous because it ensures a short preamble time since useful data is captured from the first frame received without having to wait for the notional 'start' frame. This in turn implies a short decode time as no time is wasted waiting for the start frame before capturing the data.

Upon capture of each frame, the image is processed in order to retrieve the code sequence data, which in the present embodiment is a binary data code sequence. The following steps are carried out on the basis of the binary information contained within the code sequence or received 3D-matrix.

The received frames are reordered, at step 102, into the correct order for that code sequence. As explained above, monitor flags are used to identify start frames, end frames, as well as the intermediate frames.

The monitor flags are also used to identify, at step 104, if any of the frames have been dropped, thereby indicating that the data contained within those frames is unreliable. If a frame has been dropped, the data contained within that frame is recoverable because of the temporal error correction which is embedded within the code sequence, and because the position of any unreliable frame(s) is known.

The data within the data regions of all of the non-dropped frames is verified/corrected, at step 106, using the same spatial EC technique (e.g. Reed-Solomon) applied by the STEC encoder, on the basis of the parity bits. Each non-dropped frame is restored to contain the data (binary elements) as it was at step 40 of FIG. 3, prior to being output.

If a pseudo-random number has been applied to each frame in the sequence, the content decoder de-scrambles the data as appropriate. The sequence of pseudo-random numbers is known at both the encoder and decoder.

The codewords positioned through the 3D-matrix are subsequently used, at step 108, to identify source segments corresponding to the originating codewords. As such, the library of source-segment-to-codeword mappings tables is also stored at the content decoder. The received codewords are used to look up the mappings tables in order to return the correct source segments.

In the embodiment where there is only one mappings table in the library, the content decoder uses the received codewords to look-up that mappings table. However, as described above there may be a plurality of mappings tables containing source-segment-to-codeword mappings of differing Hamming distances and/or bit lengths.

In one embodiment, a system of trial and error may be used to identify which of the plurality of mappings tables should be used by the decoder to decode the data string. All of the errors present in a received code sequence should be correctable, and all of the codewords in the code sequence should be identifiable in a suitable mappings table. The unsuitability of each mappings table can be determined on the basis of whether any of the codewords (as corrected) are not found in that mappings table.

For example, if the codeword [1 0 0 1] is received in a code sequence where no frames where dropped and this codeword is not in a mappings table, then that mappings table must be determined to be unsuitable. This system of trial and error is repeated for all of the mappings tables until all of the codewords received, even those where dropped frames have occurred, are identified in the suitable mappings table.

In another embodiment, information regarding the level of temporal error correction may be included within the code sequence such that the suitable mappings table can be determined. This may include information relating to the Hamming distance of the mappings table used by the STEC encoder and/or the number of bits in each codeword.

In the embodiment where a preset EC parameter set is used, an indication of which preset was used by the STEC encoder is included within the code sequence in order to determine the suitable mappings table.

In another embodiment, the positioning of the data regions and parity regions may vary depending upon which preset EC parameter set is used by the STEC encoder. For example, if there are four presets then four different data region/parity region layouts may be used. In this embodiment, it can be determined when carrying out the spatial error correction which layout (and therefore which preset) has been used by again using a trial and error method. In other words, if is not possible to verify the data within the data regions using the spatial error correction algorithm based on the layout of one preset, it is determined that that layout (preset) is not suitable. This system of trial and error is repeated for all each of the different layouts until the data in the data region is verified by the spatial error correction algorithm.

As described above, if any frames have been dropped, the bit associated with that frame in the codeword is marked as being an erasure bit. For each codeword, all non-erasure bits are compared with the codewords in the mappings table until a match is found. From that match the correct codeword can be determined, but more importantly, from that codeword, the associated source segment can be identified.

These source segments are returned, at step 110, in order to reconstruct the data string. The data in the string being available for subsequent processing for display to or use by a user.

It is to be appreciated that the step of populating the 3D-matrix with codewords, step 36 of FIG. 3, may be carried out in any order provided that reconstruction of the data string is carried out in the same order.

Figure 8:
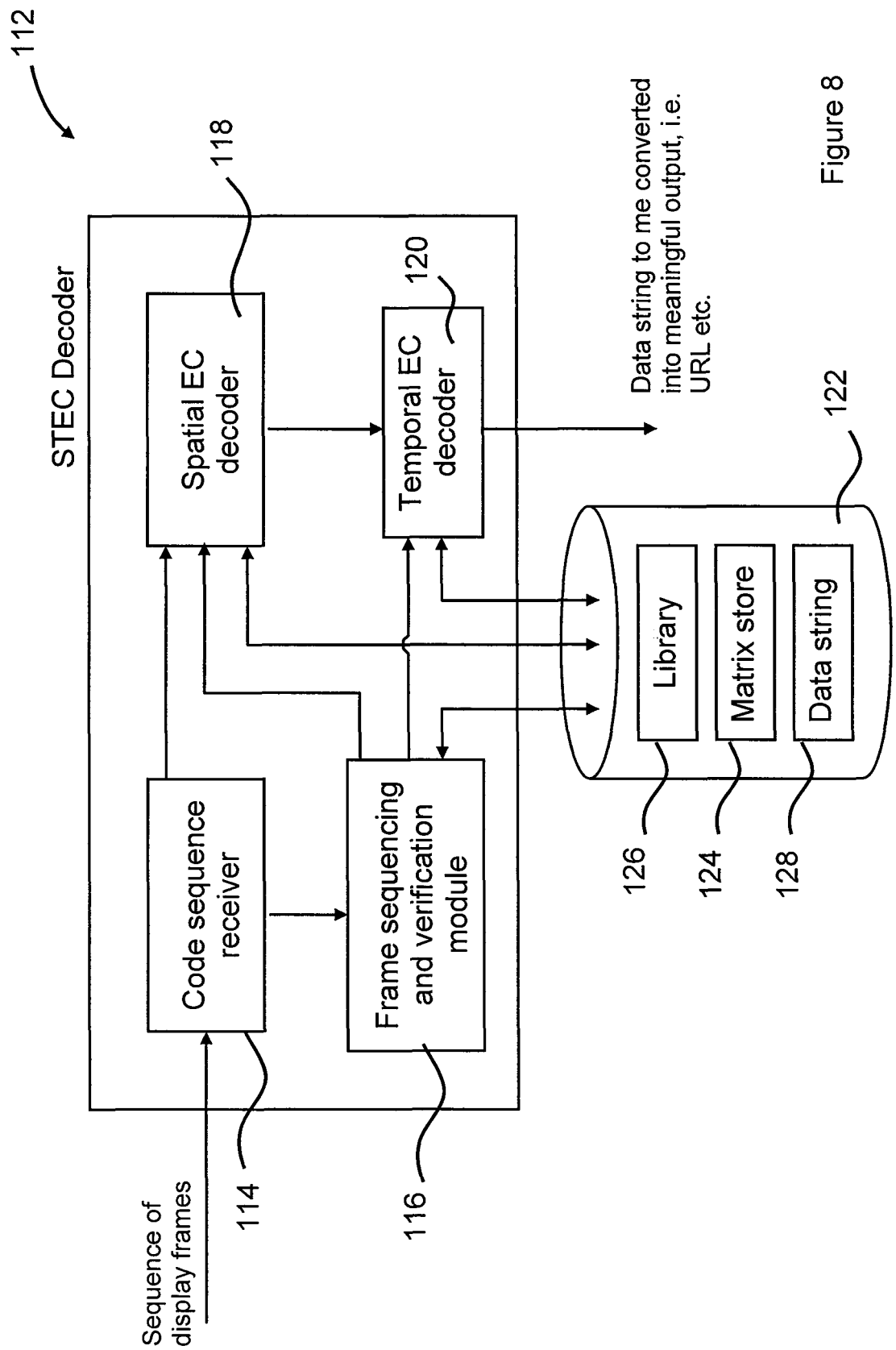
FIG. 8 is a schematic block diagram of the functional components within a decoder arranged to carry out the method steps of FIG. 7.

FIG. 8 shows a schematic block diagram of functional blocks of a spatio-temporal error correction (STEC) decoder 112 which is an exemplary method of implementing the steps shown in FIG. 7. As shown, the STEC decoder 112 comprises: a code sequence receiver 114, for receiving a sequence of display frames containing binary elements (a code sequence 74); a frame sequence and verification module 116, for arranging the sequence of display frames into a specified order and determining if the sequence of frames contains any errors indicative of dropped or duplicated frames; a spatial error correction decoder 118, for verifying the binary elements within the data region on the basis of the spatial error correction bits (parity bits); and a temporal EC decoder 120 for retrieving source segments from codewords positioned through the resulting 3D-matrix, the temporal EC decoder being arranged to store the source segments in order to compile the data string 50 as it was prior to being encoded and transmitted (i.e. visually displayed and captured).

The STEC decoder 112 has access to a data store 122, within which are three regions: a matrix store region 124, for storing the 3D-matrix as it is received, reordered and verified; a library region 126, for storing a library of codeword-to-source segment mappings tables (containing the same mappings as that of the library of source-segment-to-codeword mappings tables of the STEC encoder of FIG. 4); and a data string region 128, for storing the data string as it is compiled.

The code sequence receiver 114 is arranged to determine the binary elements within each frame as they are received and pass each frame to the frame sequencing and verification module. As described above the frames may be received in any order because the monitor flags are available to determine the stop, start and intermediate frames. As a result, useful data can be derived from the first grid received without having to wait for any notional 'start' of the sequence.

For example, in one embodiment spatial error correction of each frame may be carried out as each frame is received without having to wait for the frames to be put in their correct order, or without having first determined whether the binary elements within that frame are deemed to be corrupt because of a partial refresh or garbled frame. However, in another embodiment the spatial EC decoder may first be informed of which frames are deemed to be corrupt before spatial error correction is carried out.

The code sequence receiver 114 determines when a complete sequence has been received by comparing the binary elements of the first received frame with each subsequently received frame, and truncates the sequence appropriately when a substantially identical frame is received. In this sense, substantially identical means that the frames are deemed to be identical, taking into account a tolerance level for any spatial noise in the transmission channel which may cause a relatively small number of differences between corresponding cells of the frames.

In one embodiment, as frames are received, they are checked for temporal error (using the monitor flags) and if they are not deemed to be dropped (i.e. not received or garbled frames or frames which where captured at partial-refresh conditions) the frames are deemed to be "good" frames. These frames are stored in a decode buffer (not shown). Where a frame is deemed to be dropped, no record is made in the corresponding location in the decode buffer. As each subsequent "good" frame is received it is checked against those already in the buffer to ascertain if the complete sequence has been received. When a complete code sequence has been received, the remaining decoding steps may be carried out.

As described above, it is possible to determine the correct sequence of frames through the monitor flags of each frame. The frame sequencing and verification module uses the monitor flags to rearrange the received frames into the correct order and to determine if any of the frames have been dropped.

When the frames have been arranged into the correct order the binary elements are stored in appropriate memory cells in the matrix store region of the data store in a 3D-matrix.

The spatial EC decoder 112 ensures that the binary elements within data regions of each frame are verified. The verified binary elements being stored within the memory cells of the 3D-matrix. This function may be carried out as each frame is received or after the frames have been arranged in the correct sequence.

Where it is determined that a frame has been dropped or is unreliable due to a partial refresh or being garbled, no binary elements are stored in the memory cells corresponding to those frames. The temporal EC decoder uses the verified binary elements and the knowledge of which frames have been dropped to recreate/fill in the binary elements of the data regions of the dropped frames.

When the memory cells of the data regions of the dropped frames have been filled, the temporal EC decoder used the codewords to determine from the library of codeword-to-source-segment mappings tables the corresponding source segment which is subsequently stored in the data string region of the data store.

When each codeword in the 3D-matrix has been converted into its corresponding source segment, the data string is completely recreated, i.e. the data within the received code sequence is decoded in its entirety.

Similar to the library of source-segment to mappings tables described above, the library of codewords-to-source-segment mappings tables may contain only one codeword-to-source-segment mappings table which is designed to contain codewords which are a minimum Hamming distance apart. However, typically the library contains a plurality of codewords-to-source-segment mappings tables, each of which corresponding to a source-segment to mappings table available at the content encoder.

As described above, in one embodiment, a system of trial and error may be used to identify which of the plurality of mappings tables should be used by the decoder to decode the data string.

Furthermore, a system of trial and error may also be used to determine the number of bits in each codeword. It is to be expected that when using the mappings table of the correct bit-length, the codewords in the sequence are identifiable from that mappings table, and this cannot be true for mappings tables which have codewords of the wrong length. In other words, when the data decodes successfully (i.e. with no irrecoverable errors) using a particular mappings table, common to both the encoder and decoder, the result is returned. Else, the decoder attempts to use another mappings table to decode the data until a successful result is obtained.

In an alternative embodiment, the codeword length may be fixed at both the encoder and the decoder, i.e. if mappings tables with only a specific codeword bit-length are used.

In another alternative embodiment, the codeword bit-length may be variable and the number of frames in a sequence may correlate to an integer multiple of the codeword length. In this embodiment, the decoder may be able to eliminate the bit-lengths of mappings tables which are not suitable for decoding on the basis of the total number of frames in the sequence (taking into account whether any frames have been dropped), because the total number of frames is (in this embodiment) an integer multiple of the codeword bit-length. For example, if the sequence comprises ten frames and the library of mappings tables has mappings tables for codewords of bit-lengths of 3, 4, and 5, then it is determined that the codeword bit-length must be 5, and the mappings tables containing codewords of that length are used to decode the data.

If it is not possible to determine the codeword bit-length from this calculation (for example if the sequence contained twelve frames, the codeword bit-length could be 3 or 4, then the system of trial and error is used. Again, tt is to be expected that when using the mappings table of the correct bit-length, the codewords in the sequence are identifiable from that mappings table, and this cannot be true for mappings tables which have codewords of the wrong length.

A mappings table is deemed to be suitable if all of the codewords within the 3D-matrix can be identified from that mappings table provided that the number of errors (dropped frames) is not equal or greater than the minimum Hamming distance of that table. The content decoder may attempt to decode each of the codewords in the 3D matrix using each of the available mappings tables until one such mappings tables is determined to be suitable.

As described above, in one embodiment a user may stipulate error correction configuration parameters individually, or in another embodiment may select to use preset error correction configuration parameters.

Example presets of differing spatial error correction (SEC) and temporal error correction (TEC) overheads are described below.

| No. | Data payload (%) | SEC (%) | TEC (total %) | TEC (% of CW) | Hamming Distance | CW length (bits) |
|---|---|---|---|---|---|---|
| 1 | 50 | 50 | 0 | 0 | 1 | 4 |
| 2 | 40 | 40 | 20 | 33 | 2 | 6 |
| 3 | 40 | 30 | 30 | 43 | 3 | 7 |
| 4 | 45 | 10 | 45 | 50 | 4 | 8 |

In a first example of a preset, Preset 1 uses 50% of the cells of each frame for spatial error correction words and uses a mappings table with a minimum Hamming distance of only 1. As such there would be no temporal error correction offered by this preset. However, 50% of the bandwidth of the transmission is available for data. This preset does not offer the advantages of the temporal error correction techniques in that this coding scheme is susceptible to dropped frames and as such loss of data. However, the flexibility offered by this configuration of the error correction overheads is advantageous as it allows the error correction to be tailored to the transmission channel. For example, this preset may be useful where the frame rate is slow, i.e. where the probability of dropped frames is relatively small.

In an example of a preset in accordance with an embodiment of the invention, Preset 4 uses only 10% of the cells of each frame for spatial error correction words and uses a mappings table with a minimum Hamming distance of 4 (4 bit source segments become 8 bit codewords). As such, 50% of the codeword is used for temporal error correction and in total 45% of the complete code sequence carries the data payload. This system is robust to three dropped frames per codeword, but the protection for errors caused by spatial noise is limited. This preset would be suitable in cases where frames are unlikely to be corrupted by spatial noise, e.g. when sampling a relatively large frame with as low density of cells, from a display device with a high level of brightness/contrast.

As shown in the above table, the balance offered by Presets 2 and 3 falls between Presets 1 and 4. Preset 2 offers a balance which may be suitable for transmission channels which suffer from low temporal noise relative to spatial noise, either because the frame rate is low such that the possibility of dropped frames is reduced or that the imaging environment is noisy such that the possibility of spatial noise is increased. Preset 3 may be suitable for average situations, as the protection offered from temporal and spatial noise is approximately equal.

Determining the number of bits/cells available for codewords, including temporal error correction, and the number of bits/cells spatial error correction parity bits, typically requires first determining what level of temporal error correction is desired. Once this is known the number of bits in each source segment is determined as this ultimately determines the number of codewords which are to be contained within the 3D-matrix.

The codewords are positioned to fit within a data region of a predetermined size. Thereafter, the remaining bits (after the monitor flag bits have been taken into account) correspond to the parity region which is available containing parity bits for spatial error correction.

In an alternative embodiment, the data string may be encoded using an alternative to the binary format described above where one cell represents one bit (i.e. a '1' or a '0'). It is to be appreciated that each cell could represent more bits by varying the characteristics of each cell. For example, the luminosity of the cells could be configured to represent a plurality of levels. Four levels of luminosity (i.e. low, medium-low, medium-high and high) could be used to represent two-bits (i.e. [00], [01], [10], and [11]). Alternatively, cells of different colours could also be used to represent multiple bits.

It is also to be appreciated that the present invention need not be limited to visual display and reception of the code sequence, i.e. the present invention is not to be limited to the particular transmission channel described in relation to the above described embodiments. The present invention could equally apply to any transmission channel, for example radio transmission or television broadcast. In that regard, a series of data is input into the STEC encoder and is translated into a 3D matrix as described. However, the sequence need not be translated into a visual sequence, rather the information within the 3D matrix can be retrieved and transmitted in a particular order, either serially or in parallel, and be reconstructed and decoded at a receiving device. In this regard, the STEC encoder can be considered as acting like a buffer where data to be transmitted is divided into a plurality of data sets, each of which are input to the STEC encoder, which acts like a buffer by rearranging the data within each data set, prior to transmission.

It will be understood that the embodiments described above are given by way of example only and are not intended to limit the invention, the scope of which is defined in the appended claims. It will also be understood that the embodiments described may be used individually or in combination.

The invention claimed is:

1. A method of generating a sequence of display frames for display on a display device derived from a data string which is encoded to include error correction in order to enable recreation of the data string at a receiving device, the method comprising the steps of:
   dividing the data string to be encoded into a plurality of source segments;
   encoding the plurality of source segments to generate a plurality of codewords, each codeword comprising a plurality of codeword bits; and
   positioning codeword bits in the sequence of frames.

2. The method as claimed in claim 1, wherein each bit is positioned in a display frame such that the bits of a codeword occupy the same relative position within a plurality of display frames through the sequence.

3. The method as claimed in claim 1, further comprising allocating each codeword bit a position in a three-dimensional matrix of cells, the three-dimensional matrix comprising a first planar axis corresponding to rows of cells, a second planar axis corresponding to columns of cells, and a longitudinal axis, which is perpendicular to the first and second planar axes, corresponding to the sequence of display frames, each display frame comprising a grid of cells arranged in rows and columns, wherein the positioning step comprises positioning the codeword bits of each codeword along the longitudinal axis of the three-dimensional matrix, the method further comprising rendering the bits within the cells of the three-dimensional matrix into a plurality of grid patterns to be displayed in the sequence of display frames.

4. The method as claimed in claim 1, further comprising:
   assigning a position within a data region of each display frame to a codeword bit;
   further encoding bits within the data region of each display frame to generate spatial error correction bits; and
   allocating the generated spatial error correction bits positions within a parity region of each display frame.

5. The method as claimed in claim 1, wherein the encoding step comprises selecting a suitable codeword from a plurality of codewords stored in a mappings table on the basis of each of the source segments.

6. The method as claimed in claim 1, further comprising configuring a level of error correction on the basis of user selectable options, wherein the configuring step generates a temporal error correction parameter, wherein the encoding step comprises selecting a suitable mappings table from a plurality of mappings tables on the basis of the temporal error correction parameter which relates to a minimum Hamming distance between codewords within each mappings table.

7. The method as claimed in claim 1, further comprising configuring a level of error correction on the basis of user selectable options, the configuring step comprising determining a bit length value of k, wherein the dividing step comprises dividing the data string into source segments of bit length k.

8. The method as claimed in claim 7, further comprising selecting a first user selectable option relating to the display frame area of the display device displaying the sequence of frames.

9. The method as claimed in claim 7, further comprising selecting a second user selectable option relating to the frame rate of the display frames within the sequence of display frames.

10. The method as claimed in claim 1, further comprising:
determining sequencing information for each display frame in the sequence of display frames; and
adding sequencing information bits related to the sequencing information to monitor flags within the sequence of display frames, each monitor flag being capable of moving between a first state and a second state.

11. A method of decoding encoded data from a sequence of display frames, the method comprising:
receiving the sequence of display frames, identifying a plurality of codewords from the sequence of display frames, representative of the encoded data, the plurality of codewords comprising a plurality of codeword bits, the codeword bits being positioned through the sequence of frames, the identifying step comprising identifying error bits within each codeword; and
decoding each codeword to retrieve a decoded data string from the sequence of frames, the decoding step comprising compensating for the error bits in dependence on the position of the error bits within the codeword and the remaining bits in the codewords.

12. The method as claimed in claim 11, wherein each bit of a codeword is positioned in a display frame such that the bits of the codeword occupy the same relative position within a plurality of display frames through the sequence.

13. The method as claimed in claim 11, further comprising determining sequencing information for each display frame within the sequence of frames, wherein the identifying step comprises determining from the sequencing information whether any of the frames were not received, the method further comprising reordering the received sequence of display frames in accordance with the sequencing information.

14. The method as claimed in claim 11, wherein each display frame includes a data region comprising a plurality of codeword bits, and a parity region comprising a plurality of spatial error correction bits, the method further comprising:
correcting, for each display frame, the codeword bits within the data region on the basis of the spatial error correction bits within the parity region, wherein the compensation of codewords in the decoding step is carried out after the correcting step.

15. The method as claimed in claim 11, wherein the decoding step comprises comparing the remaining bits of a codeword with corresponding bits of a plurality of codewords stored in a mappings table and identifying a source segment of the decoded data string, wherein the decoding step further comprises concatenating a plurality of identified source segments to complete the decoded data string.

16. The method as claimed in claim 11, wherein the decoding step comprises selecting a suitable mappings table from a plurality of mappings tables, each one of the plurality of mappings tables being used in turn to verify and decode the codewords until a mappings table is determined to be suitable.

17. An encoder for encoding a data string within a sequence of display frames for display on a display device, the sequence being encoded to include error correction in order to enable recreation of the data string at a receiving device, the encoder comprising:
a data string divider arranged to divide the data string to be encoded into a plurality of source segments;
an encoder arranged to encode the plurality of source segments to generate a plurality of codewords, each codeword comprising a plurality of codeword bits; and
a codeword positioning means arranged to position the codewords, wherein the codeword bits are positioned through the sequence of frames.

* * * * *